United States Patent
Jang

(10) Patent No.: US 7,502,269 B2
(45) Date of Patent: *Mar. 10, 2009

(54) SEMICONDUCTOR MEMORY DEVICE CAPABLE OF CONTROLLING DRIVABILITY OF OVERDRIVER

(75) Inventor: Ji-Eun Jang, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/073,738

(22) Filed: Mar. 10, 2008

(65) Prior Publication Data

US 2008/0159045 A1 Jul. 3, 2008

Related U.S. Application Data

(63) Continuation of application No. 11/019,188, filed on Dec. 23, 2004, now Pat. No. 7,362,631.

(30) Foreign Application Priority Data

Apr. 30, 2004 (KR) ................. 2004-30611

(51) Int. Cl.
   *G11C 7/00* (2006.01)
   *G11C 8/00* (2006.01)
(52) U.S. Cl. ............ 365/201; 365/205; 365/207; 365/208; 365/226; 365/230.06
(58) Field of Classification Search ........... 365/201, 365/205, 207, 208, 226, 230.06
   See application file for complete search history.

(56) References Cited

U.S. PATENT DOCUMENTS 5,764,580 A 6/1998 Suzuki et al.
5,909,402 A 6/1999 Joo
6,459,639 B2 10/2002 Nishimura
6,477,100 B2 11/2002 Takemura et al.
6,717,880 B2 4/2004 Jeong
6,754,122 B2 6/2004 Wada et al.
6,853,593 B1 2/2005 Bae
6,888,765 B1 5/2005 Kotowski et al.
7,038,957 B2 * 5/2006 Kwack et al. ............... 365/201
7,349,275 B2 * 3/2008 Tsukada ..................... 365/205

FOREIGN PATENT DOCUMENTS

JP 2000-022108 1/2000
JP 2003-203484 7/2003

* cited by examiner

*Primary Examiner*—Trong Phan
(74) *Attorney, Agent, or Firm*—Lowe Hauptman Ham & Berner, LLP

(57) ABSTRACT

A semiconductor memory device capable of controlling a drivability of an overdriver is provided. The semiconductor memory device includes: a first power supply for supplying a normal driving voltage; a memory cell array block; a bit line sense amplifier block for sensing and amplifying voltage difference between bit line pair of the memory cell array block; a first driver for driving a power supply line of the bit line sense amplifier block to a voltage of a node connected with the first power supply in response to a driving control signal; a plurality of second drivers for driving the node to an overdriving voltage higher than the normal driving voltage; and an overdriving drivability controller for selectively activating the second drivers in response to a test-mode drivability control signal inputted during an activation period of an overdriving signal.

7 Claims, 6 Drawing Sheets

US 7,502,269 B2

SEMICONDUCTOR MEMORY DEVICE CAPABLE OF CONTROLLING DRIVABILITY OF OVERDRIVER

CROSS REFERENCE TO RELATED APPLICATION

This application is a Continuation of U.S. Ser. No. 11/019,188, filed on Dec. 23, 2004 now U.S. Pat. No. 7,362,631. This application, in its entirety, is incorporated herein by reference.

FIELD OF INVENTION

The present invention relates to a semiconductor design technology; and, more particularly, to a semiconductor memory device capable of controlling a drivability of an overdriver.

DESCRIPTION OF PRIOR ART

Since a low driving voltage is used for the low power consumption, a memory device including a DRAM employs an overdriving structure to help an operation of a sense amplifier.

In general, if word lines are activated by row addresses, data stored in a plurality of memory cells connected to word lines are transferred to bit lines and a bit line sense amplifier (BLSA) sense and amplify voltage difference between bit line pair.

During the above operation, thousands of bit line sense amplifiers are operated at the same time. Thus, a driving time of the bit line sense amplifier is determined by an amount of current supplied thereto. However, with the tendency of the low driving voltage for the low power consumption, it is difficult to instantly supply a sufficient amount of current. To solve it, an overdriving structure for a bit line sense amplifier is proposed. In the overdriving structure, a voltage higher than a normal voltage (generally, an internal core voltage) is instantly supplied to a power supply line (rto) of the bit line sense amplifier at an initial operation of the bit line sense amplifier, that is, just after a charge sharing between a cell and a bit line.

FIG. 1 is a circuit diagram of a semiconductor memory device having an overdriving structure according to the prior art.

Referring to FIG. 1, the semiconductor memory device includes a memory cell array block 10, a bit line sense amplifier block 20, a driver PM2, an overdriver PM1, and a driver NM1.

When a word line driving signal WL is applied to a word line, the bit line sense amplifier block 20 senses and amplifies voltage difference between a bit line pair bit and bitb of the memory cell array block 10. The driver PM2 is activated in response to a driving control signal sap and drives a power supply line rto of the bit line sense amplifier block 20 to a voltage of a node N1 connected with a core voltage terminal VCORE. The overdriver PM1 is activated by an overdriving signal saovb through inverters I1 and I2 and drives the node N1 to an external voltage VDD higher than an internal core voltage VCORE. The driver NM1 is activated in response to a driving control signal san and drives a power supply line sb of the bit line sense amplifier to a ground voltage VSS.

Further, a bit line sense amplifier 22 amplifies voltage difference between bit line pair of the bit line sense amplifier block 20. Transistors NM3 and NM4 precharge the power supply lines rto and sb of the bit line sense amplifier 22 to a power supply voltage VBLP in response to an equalization signal bleq. Also, a transistor NM2 connects the power supply lines rto and sb of the bit line sense amplifier 22 in response to the equalization signal bleq, thereby allowing the power supply lines rto and sb to maintain the same voltage.

FIG. 2 shows a variation in a voltage level of the bit line pair according to a control signal.

First, if the equalization signal bleq is activated during a precharge period, the power supply voltage VBLP is applied to the power supply line rto and sb of the bit line sense amplifier.

Next, a word line driving signal WL is activated and thus a memory cell data is applied on the bit line pair bit and bitb (bit/bitb) in a form of a fine voltage. Then, the driving control signals san and sap are activated and the driving voltages VCORE and VSS are applied to the driving lines rto and sb of the bit line sense amplifier. Due to the overdriving signal saovb applied when the bit line sense amplifier is initially driven, the driving line rto has a level higher than the normal voltage VCORE.

Meanwhile, during an initial driving, the overdriver is used to connect the normal voltage VCORE to the external voltage VDD for a short time in order to drive the bit line sense amplifier much faster. At this time, a drivability of the overdriver is important. If the drivability of the overdriver is low, a level of the normal voltage VCORE is lowered even though the normal voltage VCORE is connected with the external voltage VDD to thereby supply the driving voltage to the bit line sense amplifier. On the contrary, if the drivability of the overdriver is high, the level of the normal voltage VCORE rises much higher than a desired level, thereby causing noise.

Accordingly, the conventional overdriver includes a test and FIB (focused in beam) so as to have an appropriate drivability. However, this method requires a long time.

SUMMARY OF INVENTION

It is, therefore, an object of the present invention to provide a semiconductor memory device capable of controlling a drivability of an overdriver.

In accordance with an aspect of the present invention, a semiconductor memory device includes: a first power supply for supplying a normal driving voltage; a memory cell array block; a bit line sense amplifier block for sensing and amplifying voltage difference between bit line pair of the memory cell array block; a first driver for driving a power supply line of the bit line sense amplifier block to a voltage of a node connected with the first power supply in response to a driving control signal; a plurality of second drivers for driving the node to an overdriving voltage higher than the normal driving voltage; and an overdriving drivability controller for selectively activating the second drivers in response to a test-mode drivability control signal inputted during an activation period of an overdriving signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Figure 1:
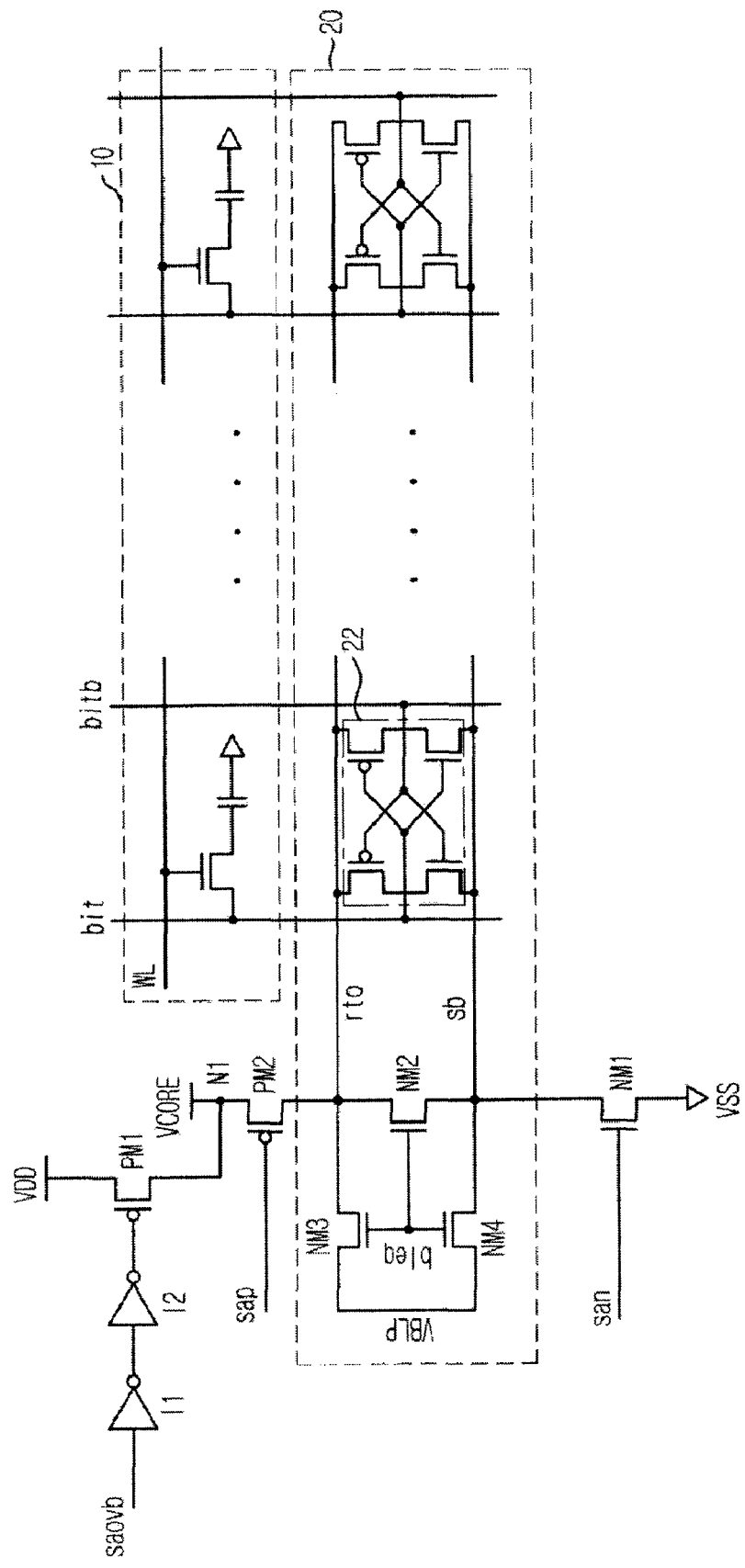
FIG. 1 is a circuit diagram of a semiconductor memory device having an overdriving structure according to the prior art.
Figure 2:
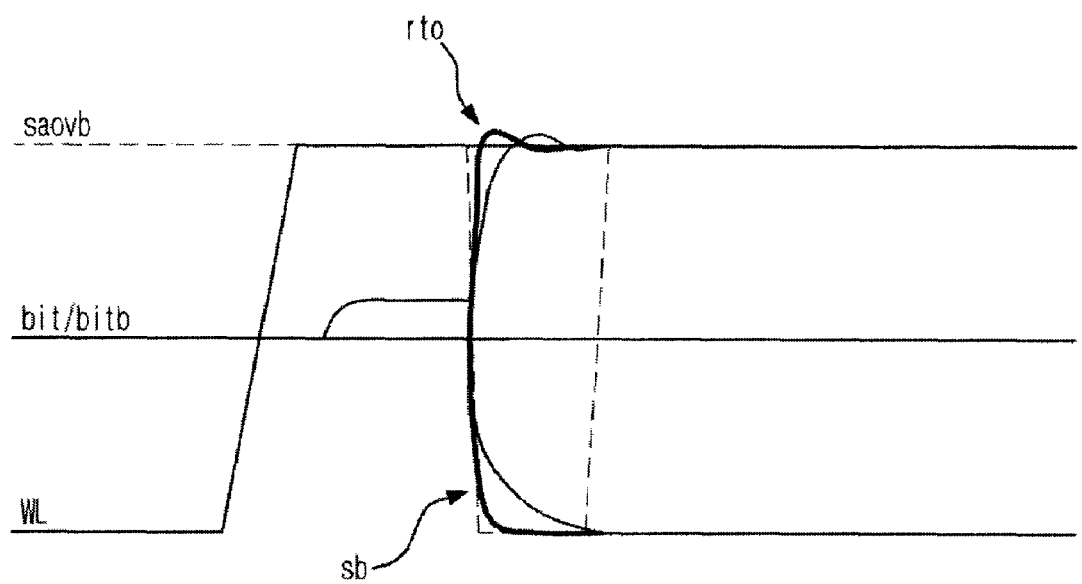
FIG. 2 is an operation waveform of the semiconductor memory device shown in FIG. 1.

Hereinafter, a semiconductor memory device having a column address path therein in accordance with the present invention will be described in detail referring to the accompanying drawings. In the drawing figures the same reference numerals have been used to indicate corresponding features.

Figure 3:
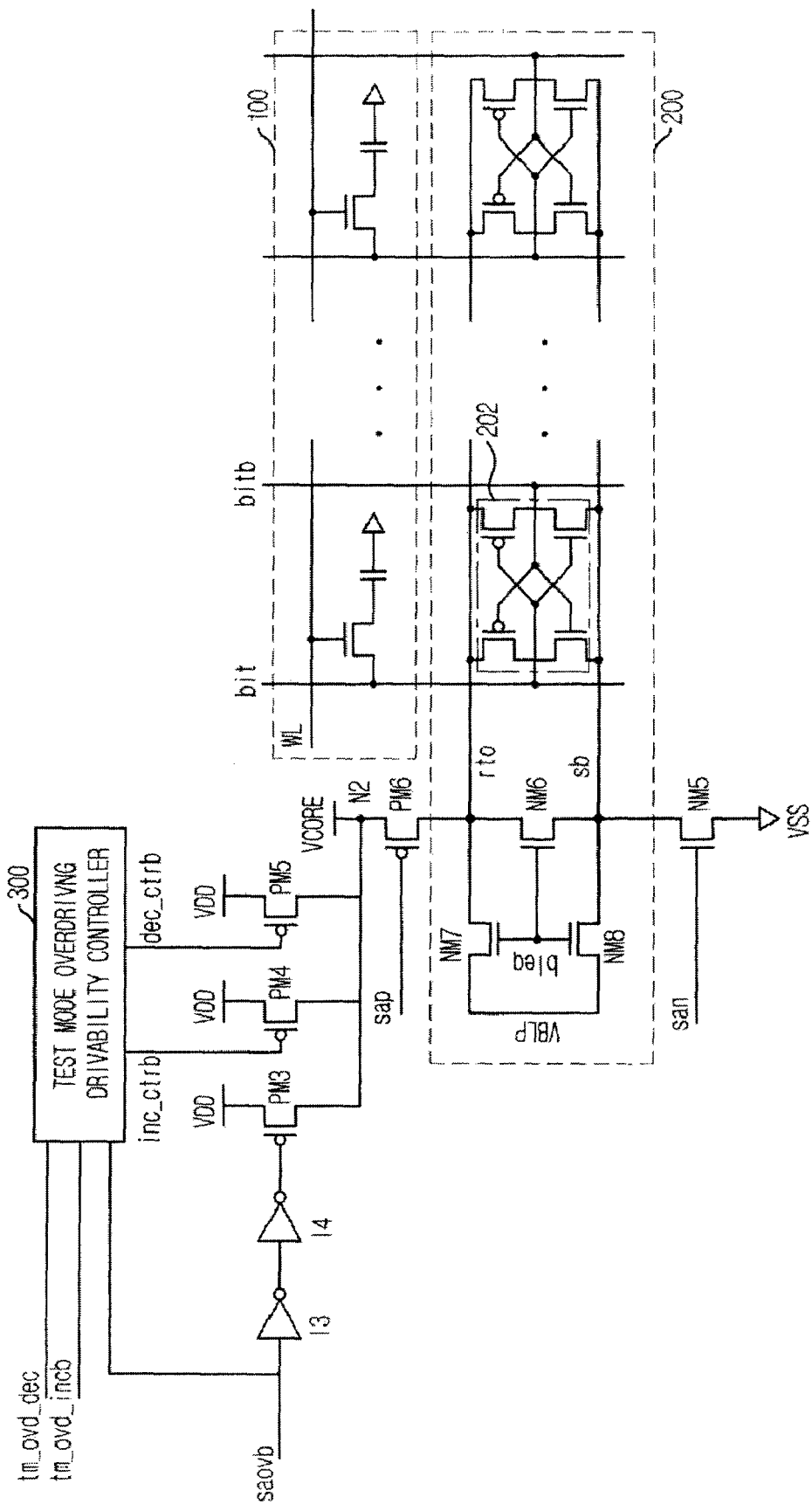
FIG. 3 is a circuit diagram of a semiconductor memory device capable of controlling a drivability of an overdriver in accordance with a preferred embodiment of the present invention.

FIG. 3 is a circuit diagram of a semiconductor memory device capable of a drivability of an overdriver in accordance with a preferred embodiment of the present invention.

Referring to FIG. 3, the semiconductor memory device in accordance with the present invention includes a memory cell array block 100, a bit line sense amplifier block 200, a normal driver PM6, a plurality of overdrivers PM3, PM4 and PM5, a test-mode overdriving drivability controller 300, and a driver NM5.

When a word line driving signal WL is applied to a word line, the bit line sense amplifier block 200 senses and amplifies voltage difference between bit line pair bit and bitb of the memory cell array block 100. The normal driver PM6 is activated in response to a driving control signal sap and drives a power supply line rto of the bit line sense amplifier block 200 to a voltage of a node N2 connected with a normal voltage VCORE. During a normal mode, the overdriver PM3 drives the node N2 to an external voltage VDD higher than the normal voltage VCORE. During a test mode, the overdrivers PM4 and PM5 in addition to the overdriver PM3 drive the node N2 to the external voltage VDD in response to a drivability increasing signal inc_ctrb and a drivability decreasing signal dec_ctrb, respectively, which are output from the test-mode overdriving drivability controller 300. The test-mode overdriving drivability controller 300 selectively activates some of the plurality of overdrivers PM4 and PM5 so as to control voltage level of the power supply line rto. The driver NM5 is activated in response to a driving control signal san and drives a power supply line sb of the bit line sense amplifier to a ground voltage VSS.

The test-mode overdriving drivability controller 300 turns on or off the respective overdrivers PM4 and PM5 in response to a test-mode drivability increasing signal tm_ovd_ovd_incb and a test-mode drivability decreasing signal tm_ovd_dec, which are activated during a test mode.

Further, a bit line sense amplifier 202 amplifies voltage difference between bit line pair bit and bitb of the bit line sense amplifier block 200. During the precharge period, the equalization signal bleq is applied to gates of the transistors NM6, NM7 and NM8 so that the transistors NM6, NM7 and NM8 turn on to precharge the power supply lines rto and sb of the bit line sense amplifier 202 to a power supply voltage VBLP, thereby allowing the power supply lines rto and sb to maintain the same voltage.

Compared with the conventional semiconductor memory device (refer to FIG. 1), the semiconductor memory device in accordance with the present invention includes the plurality of overdrivers MP3, MP4 and MP5 and the test-mode overdriving drivability controller 300 for controlling the overdrivers MP3, MP4 and MP5. Before the overdrivers are set through a test, some of the overdrivers MP3, MP4 and MP5 are enabled when the overdriving signal saovb is activated. Accordingly, the semiconductor memory device can selectively drive the plurality of overdrivers MP3, MP4 and MP5 through the test-mode overdriving drivability controller 300, such that a total drivability of the overdrivers is controlled. Thus, the voltage of the driving line rto of the bit line sense amplifier is maintained at a desired level. That is, depending on the situation, the drivability of the overdrivers can be controlled through the setup.

Figure 4:
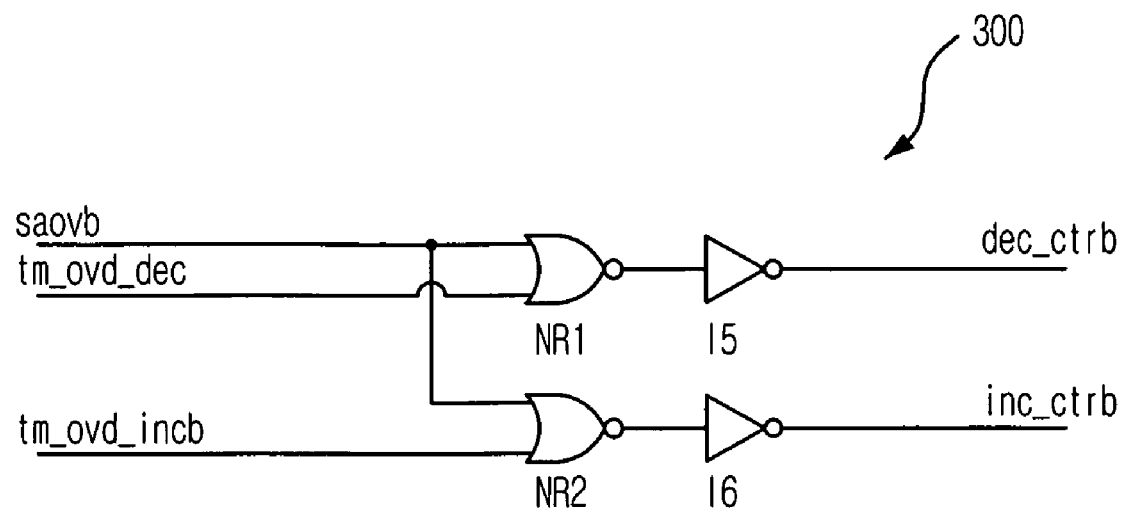
FIG. 4 is a circuit diagram of a test-mode overdriving drivability controller in accordance with a first embodiment of the present invention.

FIG. 4 is a circuit diagram of the test-mode overdriving drivability controller 300 in accordance with a first embodiment of the present invention.

Referring to FIG. 4, the test-mode overdriving drivability controller 300 includes NOR gates NR1 and NR2 and inverters I5 and I6. The NOR gate NR1 receives the overdriving signal saovb and the test-mode drivability decreasing signal tm_ovd_dec, and the NOR gate NR1 receives the overdriving signal saovb and the test-mode drivability increasing signal tm_ovd_incb. The inverter I5 inverts an output signal of the NOR gate NR1 to generate a drivability decreasing signal dec_ctrb for controlling the overdriver PM4. Also, the inverter I6 inverts an output signal of the NOR gate NR2 to generate a drivability increasing signal inc_ctrb for controlling the overdriver PM5.

Hereinafter, an operation of the test-mode overdriving drivability controller 300 will be described in detail.

When the overdriving signal saovd is in an inactive state before the initial setup, the test-mode drivability decreasing signal tm_ovd_dec has a logic low level and the test-mode drivability increasing signal tm_ovd_incb has a logic high level. Then, in entering the test mode, the test-mode drivability decreasing signal tm_ovd_dec has a logic high level and the test-mode drivability increasing signal tm_ovd_incb has a logic low level. Accordingly, before the setup, the test-mode overdriving drivability controller 300 activates the drivability decreasing signal dec_ctrb in response to the overdriving signal saovb and deactivates the drivability increasing signal inc_ctrb. In this manner, at an initial driving of the bit line sense amplifier, the external voltage VDD is applied to the normal voltage VCORE through the overdrivers PM3 and PM5 controlled by the overdriving signal saovb and the drivability decreasing signal dec_ctrb.

Then, in the test mode, the drivability of the overdriver can be controlled by the test-mode drivability increasing signal tm_ovd_incb and the test-mode drivability decreasing signal tm_ovd_dec. If the drivability of the overdriver needs to be decreased, the test-mode drivability decreasing signal tm_ovd_dec is set to a logic high level. On the contrary, if the drivability of the overdriver needs to be increased, the test-mode drivability increasing signal tm_ovd_incb is set to a logic low level. In order to control the drivability of the overdriver, the test-mode overdriving drivability controller 300 generates a control signal in response to the test-mode drivability increasing signal tm_ovd_incb and the test-mode drivability decreasing signal tm_ovd_dec.

Figure 5:
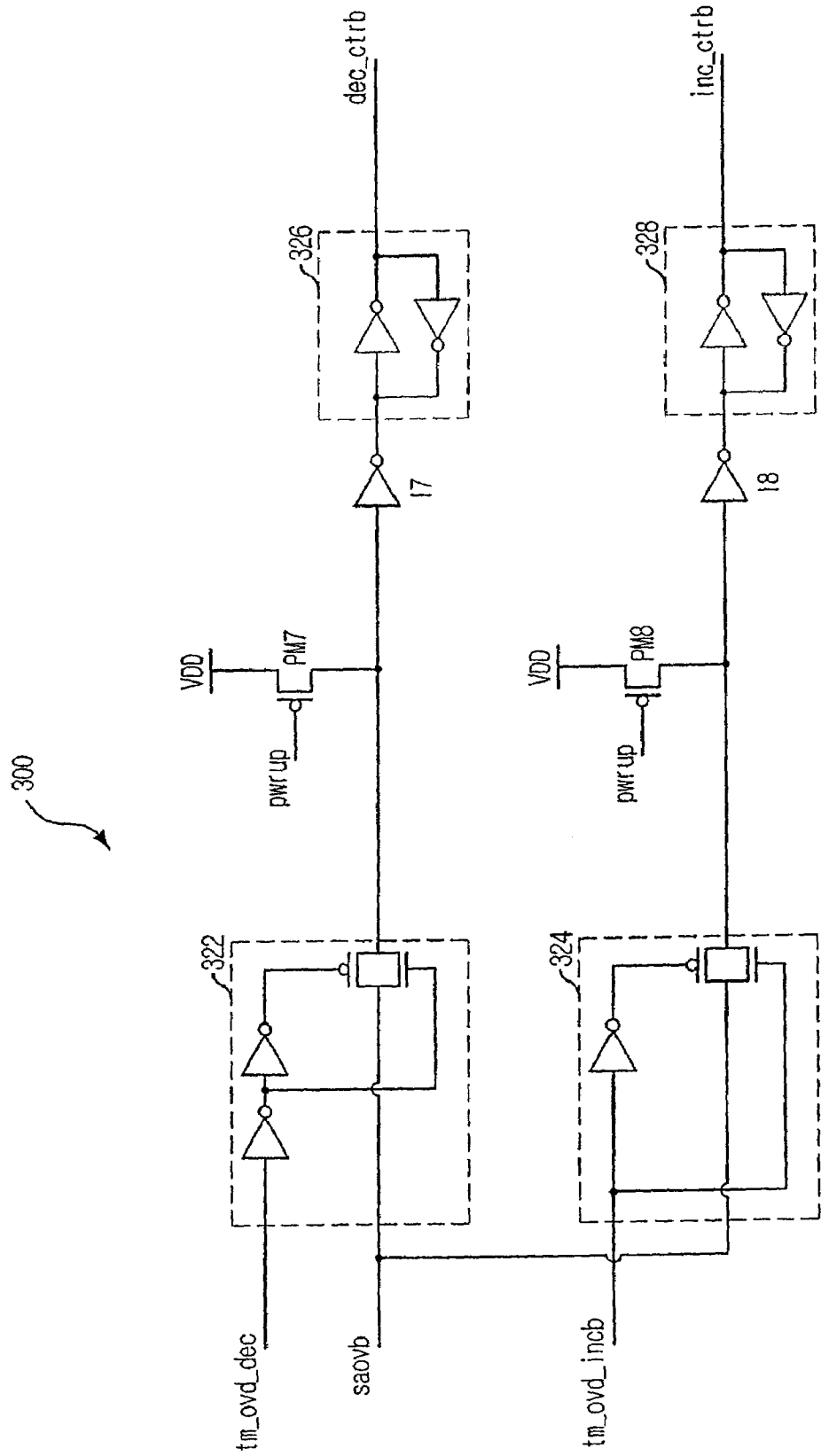
FIG. 5 is a circuit diagram of a test-mode overdriving drivability controller in accordance with a second embodiment of the present invention.

FIG. 5 is a circuit diagram of the test-mode overdriving drivability controller 300 in accordance with a second embodiment of the present invention.

Referring to FIG. 5, the test-mode overdriving drivability controller 300 includes transfer gates 322 and 324, latches 326 and 328, and PMOS transistors PM7 and PM8.

The transfer gate 322 transfers the overdriving signal saovb in response to the test-mode drivability decreasing signal tm_ovd_dec and the transfer gate 324 transfers the overdriving signal saovb in response to the test-mode drivability increasing signal tm$_{ovd}$_incb. The latch 326 latches an output signal of the transfer gate 322 through an inverter I7 and generates the drivability decreasing signal dec_trb, and the latch 328 latches an output signal of the transfer gate 344 through an inverter I8 and generates the drivability increasing signal inc_ctrb.

The PMOS transistors PM7 and PM 8 are provided at output nodes of the transfer gates 322 and 324, respectively. The PMOS transistor PM7 has a gate receiving a power-up signal pwrup and maintains the output node of the transfer gate 322 to a logic high level, thereby turning off the overdriver MP4. The PMOS transistor PM8 has a gate receiving a power-up signal pwrup and maintains the output node of the transfer gate 324 to a logic high level, thereby turning off the overdriver MP5.

Figure 6:
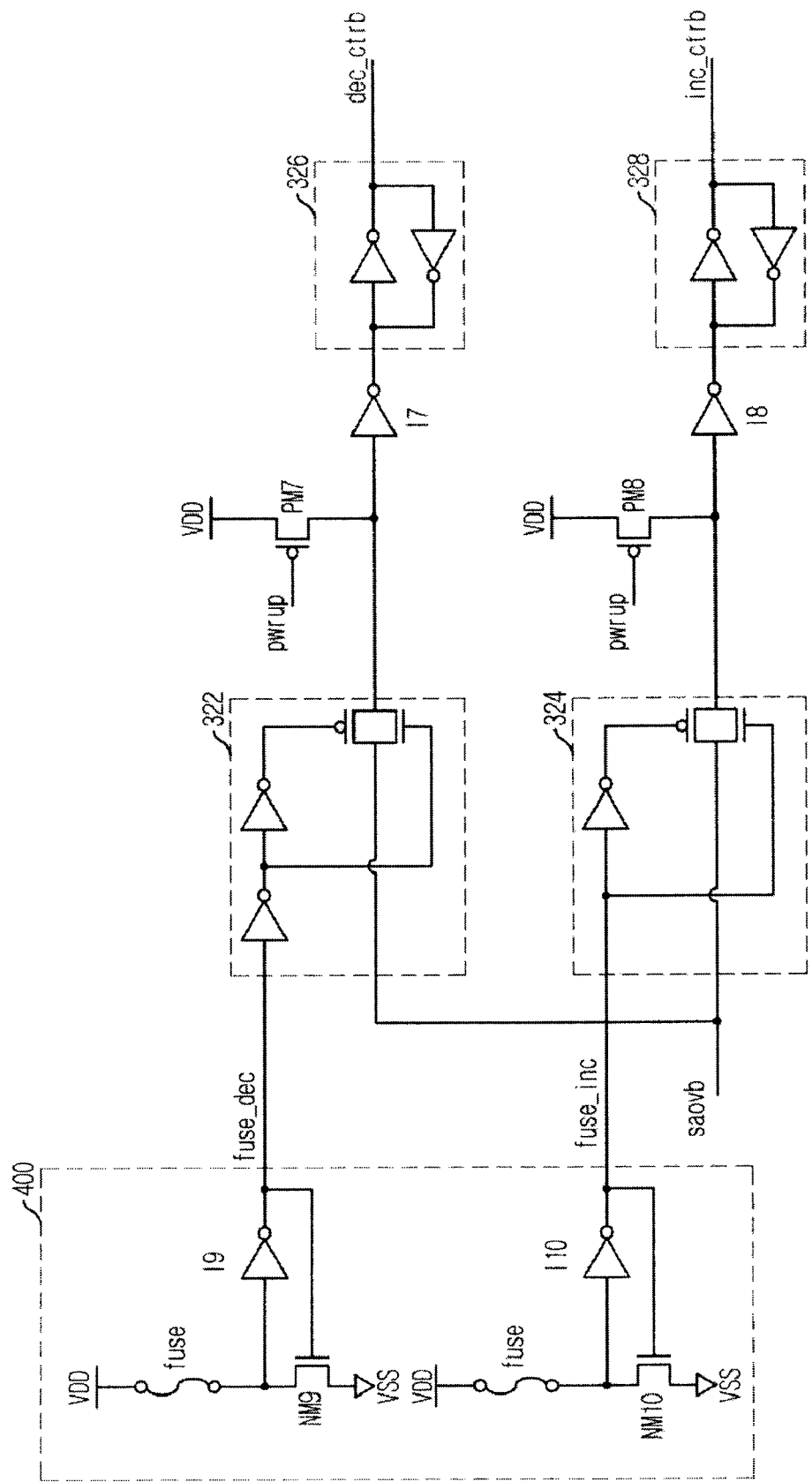
FIG. 6 illustrates a case where a test input is received through a fuse option in accordance with a preferred embodiment of the present invention.

FIG. 6 shows a case where the input signals of the test-mode overdriving drivability controller shown in FIG. 5 is received through a fuse option. Operation of all the circuits and signals, including the transfer gates 322 and 324, the latches 326 and 328, the PMOS transistors PM7 and PM8, inverters I7 and I8, the overdriving signal saovb and the power-up signal pwerup, are identical to the test mode overdriving drivability controller 300 in FIG. 5, except that a fuse drivability decreasing signal fuse_dec and a fuse drivability increasing signal fuse_inc are provided from a fuse circuit 400 instead of the test-mode drivability decreasing signal tm_ovd_dec and the test-mode drivability increasing signal tm_ovd_incb. When fuses are intact in the fuse circuit 400, the external voltage VDD is input to inverters I9 and I10 and turns off NMOS transistors NM9 and NM10 so that the fuse drivability decreasing signal fuse_dec and the fuse drivability increasing signal fuse_inc have a logic low level. When one of the fuse is blown electrically or by a laser source, either the fuse drivability decreasing signal fuse_dec or the fuse drivability increasing signal fuse_inc becomes to have a logic high level. Therefore, the input values to the transfer gates 322 and 324 can be set through the fuses.

In accordance with the present invention, the signals are set in the test mode and the drivability of the overdriver is controlled, thereby reducing a time necessary to control the drivability. In addition, a time necessary to analyze the drivability of the overdriver can be reduced.

Although three overdrivers are described in the embodiments, the present invention is not limited to it.

The present application contains subject matter related to Korean patent application No. 2004-30611, filed in the Korean Patent Office on Apr. 30, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a memory block;
   a bit line sensing and amplifying unit for sensing and amplifying a voltage difference between a bit line pair of the memory block;
   a normal driver for driving a power supply line of the bit line sensing and amplifying unit to a normal driving voltage in response to a driving control signal;
   a test mode over-driver for driving a node supplying the normal driving voltage to an overdriving voltage higher than the normal driving voltage; and
   an overdriving drivability controller for selectively activating the test mode over-driver in response to test-mode drivability control signals inputted during an activation period of an overdriving signal.

2. The semiconductor memory device as recited in claim 1, wherein the overdriving drivability controller generates a drivability increasing signal and a drivability decreasing signal in response to the test-mode drivability control signals, wherein the test-mode drivability control signals include a test-mode drivability increasing signal and a test-mode drivability decreasing signal.

3. The semiconductor memory device as recited in claim 2, wherein the overdriving drivability controller includes:
   a first NOR gate for receiving the overdriving signal and the test-mode drivability increasing signal;
   a first inverter for inverting an output signal of the first NOR gate to output the drivability increasing signal;
   a second NOR gate for receiving the overdriving signal and the test-mode drivability decreasing signal; and
   a second inverter for inverting an output signal of the second NOR gate to output the drivability decreasing signal.

4. The semiconductor memory device as recited in claim 2, wherein the overdriving drivability controller includes:
   a first transfer gate for transferring the overdriving signal in response to the test-mode drivability increasing signal;
   a first latch for delaying an output signal of the first transfer gate to output the drivability increasing signal;
   a second transfer gate for transferring the overdriving signal in response to the test-mode drivability decreasing signal;
   a second latch for delaying an output signal of the second transfer gate to output the drivability decreasing signal; and
   first and second PMOS transistors for applying a high voltage to output nodes of the first and second transfer gates when a power-up signal is deactivated.

5. The semiconductor memory device as recited in claim 3, wherein the test mode over-driver comprises first to third MOS transistors having source-drain paths between the overdriving voltage and the node, the first to third MOS transistors having gates receiving the overdriving signal, the drivability increasing signal and the drivability decreasing signal, respectively.

6. A method for driving a semiconductor memory device, said method comprising:
   sensing and amplifying voltage difference between a bit line pair of the memory device;
   in response to a driving control signal, supplying a normal driving voltage to a power supply line to control said sensing and amplifying;
   driving a node supplying the normal driving voltage to an overdriving voltage higher than the normal driving voltage; and
   controlling said driving in response to test-mode drivability control signals inputted through a fuse option.

7. The method as recited in claim 6, wherein the test-mode drivability control signals include a test-mode drivability increasing signal and a test-mode drivability decreasing signal inputted according to cutting fuses through the fuse option.

* * * * *